(12) United States Patent
Ogawa et al.

(10) Patent No.: US 8,319,675 B2
(45) Date of Patent: Nov. 27, 2012

(54) ANALOG-TO-DIGITAL CONVERTER

(75) Inventors: Tomohiko Ogawa, Kiryu (JP); Haruo Kobayashi, Kiryu (JP)

(73) Assignee: Semiconductor Technology Academic Research Center, Yokohama-shi, Kanagawa (JP)

( * ) Notice: Subject to any disclaimer, the term of this patent is extended or adjusted under 35 U.S.C. 154(b) by 47 days.

(21) Appl. No.: 12/959,165

(22) Filed: Dec. 2, 2010

(65) Prior Publication Data

US 2011/0133971 A1    Jun. 9, 2011

(30) Foreign Application Priority Data

Dec. 3, 2009   (JP) ................................. 2009-275716

(51) Int. Cl.
*H03M 1/12*    (2006.01)
(52) U.S. Cl. ........ 341/155; 341/156; 341/172; 341/120; 341/161
(58) Field of Classification Search .................. 341/155, 341/156, 172, 120, 161
See application file for complete search history.

(56) References Cited

U.S. PATENT DOCUMENTS

| | | | | |
|---|---|---|---|---|
| 6,784,810 | B2 * | 8/2004 | Falik et al. ....................... | 341/26 |
| 2002/0175835 | A1 * | 11/2002 | Falik et al. ....................... | 341/26 |
| 2004/0130474 | A1 * | 7/2004 | Yamada ......................... | 341/161 |
| 2008/0180289 | A1 * | 7/2008 | Su et al. ......................... | 341/120 |
| 2008/0218393 | A1 * | 9/2008 | Kuramochi et al. .......... | 341/143 |

OTHER PUBLICATIONS

Kuttner et al. "A 1.2V 10b 20MSample/s Non-binary successive approximation ADC in 0.13μm CMOS." *IEEE International Solid-State Circuits Conference.* 2002. 21 pages.
Hesener et al. "A 14B 40MS/s Redudndant SAR ADC with 480MHz Clock in 0.13μm CMOS." *IEEE International Solid-State Circuits Conference.* 2007. 6 pages.
Ogawa et al. "SAR ADC Algorithm with Redundancy." *IEEE.* 2008. pp. 268-271.
Craninckx et al. "A 65fJ/Conversion-Step 0-to-50MS/s 0-to0.7mW 9b Charge-Sharing SAR ADC in 90nm Digital CMOS." *IEEE International Solid-State Circuits Conference.* 2007. 3 pages.
Giannini et al. "An 820μW 9b 40MS/s Noise-Tolerant Dynamic-SAR ADC in 90nm Digital CMOS." *IEEE International Solid-State Circuits Conference.* 2008. pp. 44 pages.

* cited by examiner

*Primary Examiner* — Jean B Jeanglaude
(74) *Attorney, Agent, or Firm* — Merchant & Gould P.C.

(57) ABSTRACT

An SAR ADC includes a digital-to-analog converter, a first comparator that compares an input analog signal with a reference analog signal, a second comparator that compares an input analog signal with a reference analog signal, a selection circuit that selects one of comparison results of the first comparator and the second comparator, and a control circuit that changes the multibit digital signal sequentially based on the selected comparison result in a plurality of steps so that the reference analog signal becomes closer to the input analog signal, and the control circuit controls the selection circuit to select the comparison result of the first comparator up to an intermediate step on the way of the plurality of steps and to select the comparison result of the second comparator after the intermediate step, and changes the bit value of the multibit digital signal according to the non-binary algorithm.

20 Claims, 14 Drawing Sheets

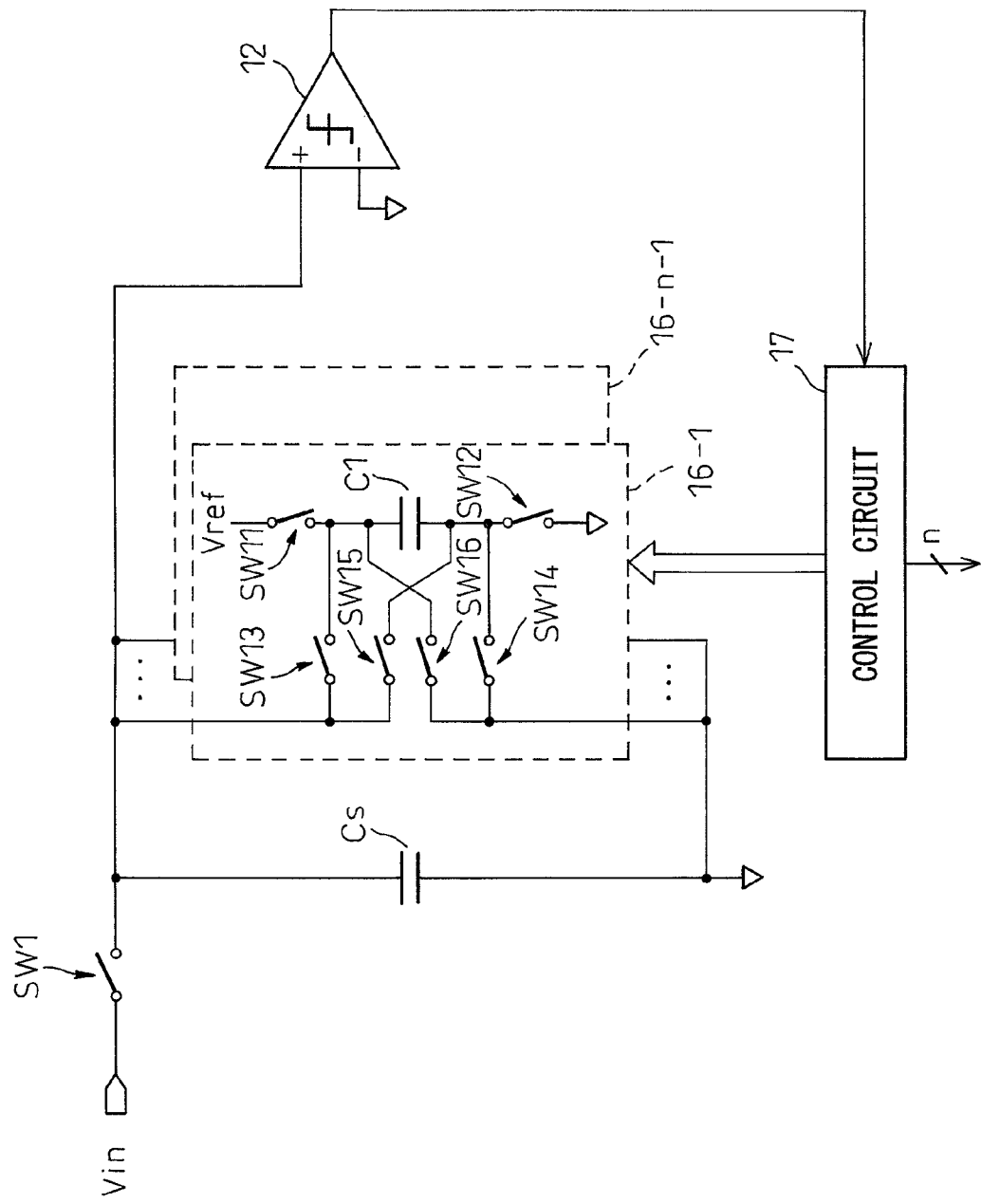

FIG.10A
|  | FIRST COMPARATOR | | | SECOND COMPARATOR | | |
|---|---|---|---|---|---|---|
| STEP | 1 | 2 | 3 | 4 | 5 | 6 |
| SHIFT WEIGHT | — | 6 | 4 | 2 | 2 | 1 |
| DETERMINATION | 1 | 1 | 0 | 0 | 1 | 1 |
| COMPARISON LEVEL | 16 | 22 | 26 | 24 | 22 | 23 |
FIG.10B
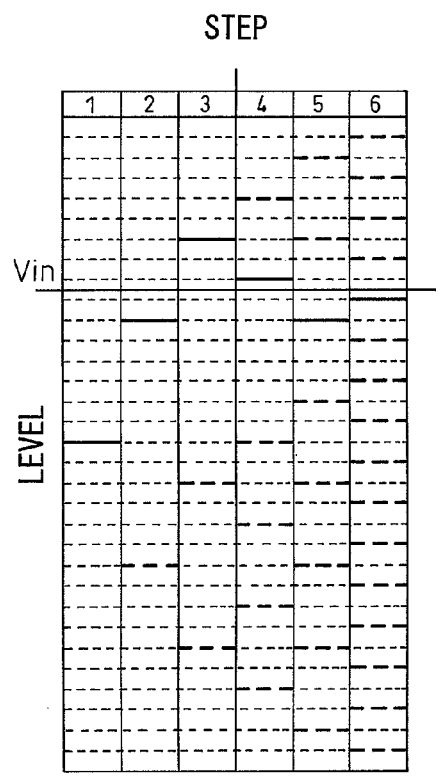
FIG.10C
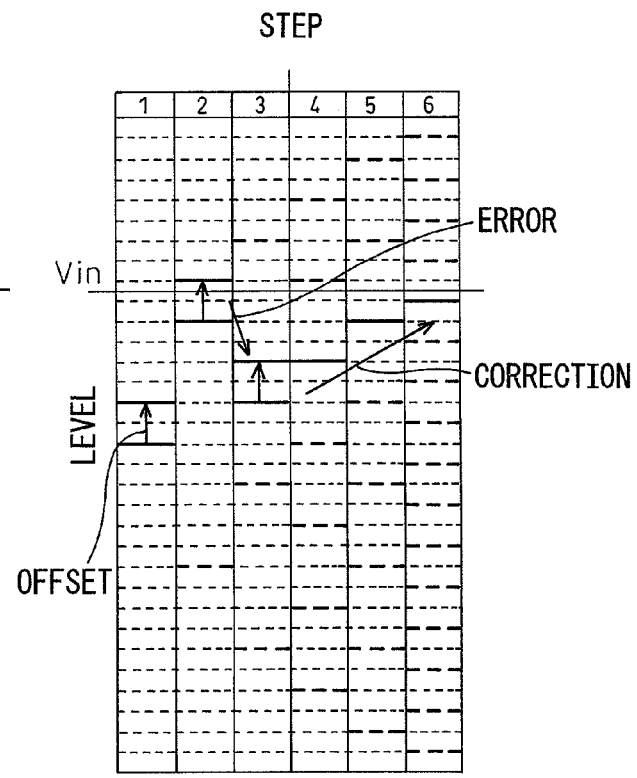

FIG.12

| k | DAC(k) | er(k) [LSB] | ALLOWED VALUE [LSB] |
|---|---|---|---|
| 1 | 512 | 7.0 | 8 |
| 2 | 256 | 7.0 | 8 |
| 3 | 128 | 7.0 | 8 |
| 4 | 64 | 7.0 | 8 |
| 5 | 32 | 7.0 | 8 |
| 6 | 16 | 7.0 | 8 |
| 7 | 8 | 0.2 | 0 |
| 8 | 8 | 0.2 | 0 |
| 9 | 4 | 0.2 | 0 |
| 10 | 2 | 0.2 | 0 |
| 11 | 1 | 0.2 | 0 |

| k | Cu(k) | er(k) [LSB] | ALLOWED VALUE [LSB] |
|---|---|---|---|
| 1 | 256 | 11.4 | 16 |
| 2 | 128 | 13.4 | 16 |
| 3 | 64 | 14.4 | 16 |
| 4 | 32 | 15.0 | 16 |
| 5 | 16 | 15.2 | 16 |
| 6 | 16 | 0.4 | 0 |
| 7 | 8 | 0.3 | 0 |
| 8 | 4 | 0.3 | 0 |
| 9 | 2 | 0.2 | 0 |
| 10 | 1 | 0.2 | 0 |

ANALOG-TO-DIGITAL CONVERTER

CROSS-REFERENCE TO RELATED APPLICATIONS

This application is based upon and claims the benefit of priority of the prior Japanese Patent Application No. 2009-275716, filed on Dec. 3, 2009, the entire contents of which are incorporated herein by reference.

BACKGROUND OF THE INVENTION

1. Technical Field of the Invention

The present invention relates to a sequential comparison-type analog-to-digital converter (SAR ADC: Successive Approximation Register Analog-to-Digital Converter).

2. Related Art

A sequential comparison-type analog-to-digital converter (ADC) mounted on a microcomputer or system LSI, is used from the viewpoint of downsizing and maintaining high precision.

FIG. 1 is a block diagram showing a configuration example of a conventional SAR ADC. FIG. 2 is a diagram for explaining a conversion operation in the SAR ADC.

As shown in FIG. 1, the conventional SAR ADC comprises a comparator 12, a control circuit 13, and a DA converter (digital-to-analog converter) 14. An analog input signal Vin is held temporarily by, for example, a sample-holding (SH) circuit 11 and input to the comparator 12.

It is assumed that the SAR ADC has n-bit (8-bit) resolution and full-scale voltage is VFS as shown in FIG. 2. In the first step, the control circuit 13 outputs a digital signal whose bit value of a first bit (b1) is "1" and whose bit values of second and subsequent bits (b2 to bn) are "0" and the DA converter 14 generates and outputs a reference analog signal Vr of a voltage corresponding to the digital signal. The voltage of the reference analog signal Vr in the first step is VFS/2. The comparator 12 compares the voltage of the analog input signal Vin with the voltage of the reference analog signal Vr and outputs a comparison result. The control circuit 13 decides the bit value of the first bit (b1) based on the comparison result. For example, when Vin is larger than Vr, b1 is decided to be "1" and when Vin is smaller than Vr, b1 is decided to be "0". In FIG. 2, b1 is "1". In the following explanation, "the comparator compares" means "the comparator compares voltages" and "the DA converter generates a reference analog signal corresponding to a digital signal" means "the DA converter generates a reference analog signal of a voltage corresponding to a digital signal".

In the second step, the control circuit 13 outputs a digital signal whose b1 is the value (here, "1") decided in the first step, whose bit value of the second bit (b2) is "1", and whose bit values of third and subsequent bits (b3 to bn) are "0" and the DA converter 14 generates and outputs the reference analog signal Vr corresponding to the digital signal. In the example in FIG. 2, the reference analog signal Vr in the second step is 3VFS/4. The comparator 12 compares the analog input signal Vin with the reference analog signal Vr and outputs a comparison result. The control circuit 13 decides the bit value of the second bit (b2) based on the comparison result. For example, when Vin is larger than Vr, b2 is decided to be "1" and when Vin is smaller than Vr, b2 is decided to be "0". In FIG. 2, b2 is "1".

Subsequently, the bit values of the third and subsequent bits are decided sequentially so that Vr becomes closer to Vin and when the bit value of the nth bit (here, the eighth bit) is decided, a state is brought about where Vr is closest to Vin, and therefore, the digital signal is output as an AD converted value.

The algorithm to change the width, by which the reference analog signal Vr explained above is changed, so that Vr becomes closer to Vin while reducing the width to ½ the width changed in the previous step is referred to as a binary algorithm.

As described above, in the SAR ADC that utilizes a DA converter, signal processing to calculate a digital value for approximation is performed by a voltage. In a general SAR ADC, the operation speed is restricted by the settling time of the output of the DA converter, and therefore, it is difficult to increase the speed, and if an element with a large drive capacity is used to increase the speed, an increase in power consumption occurs.

F. Kuttner ("A 1.2V 10b 20MS/S Non-Binary Successive Approximation ADC in 0.13 um CMOS" Tech. Digest of ISSCC (February 2002)) and M. Hesener, T. Eichler, A. Hanneberg, D. Herbison, F. Kuttner, H. Wenske ("A 14b 40MS/s Redundant SAR ADC with 480 MHz Clock in 0.13 um CMOS" Tech. Digest of ISSCC (February 2007)) propose the method in which the cycle time is reduced and the settling error resulting from the comparison in a state where the settling of the output of the DA converter is insufficient is allowed by applying the non-binary algorithm. With this method, although the number of steps becomes larger than when the binary algorithm is applied, the cycle time is reduced, and therefore, the speed can be increased as a whole.

However, with this method, the number of steps is increased, and therefore, if a dynamic comparator is used, the power consumption is increased by an amount corresponding to an increase in the number of steps.

T. Ogawa, H. Kobayashi, M. Hotta, Y. Takahashi, H. San, N. Takai ("SAR ADC Algorithm with Redundancy", IEEE Asia Pacific Conference on Circuits and Systems, Macao, pp. 268-271, December 2008) describes the non-binary (redundant) algorithm in the SAR ADC that uses a DA converter.

On the other hand, in order to solve the problem of the settlement time of the output of the DA converter being long, recently, J. Craninckx and G. Van der Plas ("A 65fJ/Conversion-Step 0-to-50MS/s 0-to-0.7 mW 9b Charge-Sharing SAR ADC in 90 nm Digital CMOS", ISSCC Dig. Tech. Papers, pp. 246-247, February 2007) and V. Giannini, P. Nuzzo, V. Chironi, A. Baschirotto, G. V. Plas, J. Craninckx ("An 820uW 9b 40MS/s Noise-Tolerant Dynamic-SARADC in 90 nm Digital CMOS", ISSCC (February 2007)) propose a charge-sharing SAR ADC as an SAR ADC capable of realizing the high-speed operation and low power consumption. In the charge-sharing SAR ADC, signal processing to calculate a digital value for approximation is performed by charges. The configuration and operation of the charge-sharing SAR ADC are explained with reference to drawings.

FIG. 3 is a diagram showing a configuration of a charge-sharing SAR ADC that outputs the voltage of the analog input signal Vin after converting it into an n-bit AD converted digital signal. As shown in FIG. 3, the charge-sharing SAR ADC comprises an input signal capacitor Cs, a plurality of reference capacitor circuits 16-1, ..., 16-n-1, the comparator 12, and a control circuit 17.

One terminal (input terminal) of the input signal capacitor Cs is connected to the input terminal of the analog input signal Vin via a switch SW1 and the other terminal (reference terminal) is connected to a power source of a reference potential (here, GND).

The reference capacitor circuit 16-1 comprises a reference capacitor C1, a switch SW11 that connects one terminal of the reference capacitor C1 to the power source of a reference voltage Vref, a switch SW12 that connects the other terminal of the reference capacitor C1 to the power source of the reference potential GND, a switch SW13 that connects one terminal of the reference capacitor C1 to the input terminal of the input signal capacitor Cs, a switch SW14 that connects the other terminal of the reference capacitor C1 to the reference terminal (GND) of the input signal capacitor Cs, a switch SW15 that connects the other terminal of the reference capacitor C1 to the input terminal of the input signal capacitor Cs, and a switch SW16 that connects one terminal of the reference capacitor C1 to the reference terminal (GND) of the input signal capacitor Cs. In such a configuration, by bringing SW13 to SW16 into an open state and SW11 and SW12 into a closed state, the reference capacitor C1 is charged to the reference voltage Vref. Further, by bringing SW11, SW12, SW15, and SW16 into the open state and SW13 and SW14 into the closed state, the reference capacitor C1 enters a forward connection state where one terminal of the reference capacitor C1 is connected to the input terminal of the input signal capacitor Cs and the other terminal is connected to the reference terminal of the input signal capacitor Cs, and by bringing SW11 to SW14 into the open state and SW15 and SW16 into the closed state, the reference capacitor C1 enters a backward connection state where one terminal is connected to the reference terminal of the input signal capacitor Cs and the other terminal to the input terminal of the input signal capacitor Cs.

The other reference capacitor circuits 16-2 to 16-n-1 have the same configuration as that of the reference capacitor circuit 16-1; however, the capacitance values of the reference capacitor C1 and reference capacitors C2 to Cn-1 are different. The capacitance values of the reference capacitors Cn-1 to C1 and the input signal capacitor Cs are set to $1:2:4, \ldots, :2^{n-2}:2^{n-1}$, that is a ratio of power of 2.

The comparator 12 determines whether the voltage of the input terminal of the input signal capacitor Cs is higher or lower than the reference potential (GND).

Based on the determination result of the comparator 12, the control circuit 17 sequentially connects the reference capacitor circuits 16-1 to 16-n-1 to the input signal capacitor Cs while selecting the connection state so that the voltage of the input terminal of the input signal capacitor Cs becomes closer to the reference potential GND, and calculates an AD converted value corresponding to the voltage of the analog input signal from the connection state of the reference capacitor circuits 16-1 to 16-n-1 when the connection of all the reference capacitor circuits 16-1 to 16-n-1 to the input signal capacitor Cs is completed and the final determination result.

FIG. 4A to FIG. 4F are diagrams explaining the operation of the charge-sharing SAR ADC in FIG. 3. For the sake of simplification of explanation, explanation is given using a case where n=3, i.e., three bits, as an example. Therefore, the two reference capacitor circuits 16-1 and 16-2 are provided, the capacitance values of the reference capacitors C2, C1 and the input signal capacitor Cs are 1:2:4 and these are expressed by C, 2C, 4C. The analog input signal Vin the charge-sharing SAR ADC can convert digitally is in a range between +Vref and −Vref and Vin outside the range is "111" or "000".

The operation of the charge-sharing SAR ADC is explained with reference to FIG. 4A to FIG. 4F.

First, a sampling step is performed. In the sampling step, as shown in FIG. 4A, SW1 is brought into the closed state and the analog input signal Vin is applied to the input signal capacitor Cs and at the same time, in the reference capacitor circuits 16-1, 16-2, SW11 and SW12 are brought into the closed state, SW1 to SW16 into the open state, and the reference voltage Vref is applied to the reference capacitors C1, C2. After that, SW1 is brought into the open state and the SW11 and SW12 into the open state. Due to this, the input signal capacitor Cs is charged with charges of Qin=4C×Vin and the reference capacitors C1 and C2 are charged with C×Vref and C×Vref.

In a first comparison step, as shown in FIG. 4B, the comparator 12 determines whether the voltage of the input terminal of the input signal capacitor Cs is higher or lower than GND.

In a second comparison step, when the determination result in the first comparison step is "1", as shown in FIG. 4C, SW15 and SW16 of the reference capacitor circuit 16-1 are brought into the closed state and one of the terminals of the reference capacitor C1 is connected to the reference terminal of the input signal capacitor Cs and the other terminal of the reference capacitor C1 is connected to the input terminal of the input signal capacitor Cs, i.e., connection is made in the backward connection state. Due to this, the total charges accumulated in the input signal capacitor Cs and the reference capacitor C1 are Qx=4C×Vin−2C×Vref and the voltage of the reference terminal is Vx=Qx/(4C+2C)=(4×Vin−2×Vref)/6. In this state, the comparator 12 makes a comparison.

When the determination result in the first comparison step is "0", as shown in FIG. 4D, SW13 and SW14 of the reference capacitor circuit 16-1 are brought into the closed state and one of the terminals of the reference capacitor C1 is connected to the input terminal of the input signal capacitor Cs and the other terminal of the reference capacitor C1 is connected to the reference terminal of the input signal capacitor Cs, i.e., connection is made in the forward connection state. Due to this, the total charges accumulated in the input signal capacitor Cs and the reference capacitor C1 are Qx=4C×Vin+2C×Vref and the voltage of the reference terminal is Vx=Qx/(4C+2C)=(4×Vin+2×Vref)/6. In this state, the comparator 12 makes a comparison.

In a third comparison step, when the determination result in the second comparison step is "1", as shown in FIG. 4E, SW15 and SW16 of the reference capacitor circuit 16-2 are brought into the closed state and one of the terminals of the reference capacitor C2 is connected to the reference terminal and the other terminal of the reference capacitor C2 is connected to the input terminal of the input signal capacitor Cs, i.e., connection is made in the backward connection state. If the total charges accumulated in the input signal capacitor Cs and the reference capacitor C1 when the second comparison step is performed is assumed to be Qx2, because of the reference capacitor C2, Qx=Qx2−C×Vref and the voltage of the reference terminal is Vx=Qx/(4C+2C+C)=(Qx2−C×Vref)/7. In this state, the comparator 12 makes a comparison.

When the determination result in the second comparison step is "0", as shown in FIG. 4F, SW13 and SW14 of the reference capacitor circuit 16-2 are brought into the closed state and one of the terminals of the reference capacitor C2 is connected to the input terminal of the input signal capacitor Cs and the other terminal of the reference capacitor C2 is connected to the reference terminal of the input signal capacitor Cs, that is, connection is made in the forward connection state. Due to this, Qx=Qx2+C×Vref and the voltage of the reference terminal is Vx=Qx/(4C+2C+C)=(Qx2+C×Vref)/7. In this state, the comparator 12 makes a comparison.

Explanation is given with a specific voltage value of Vin as an example. FIG. 5 is a diagram explaining an example of a change in a voltage Vx of the input terminal when 0 (GND) <Vin<+Vref/4 and in this case, the correct conversion result is that the digitally converted value is "100".

At the time of the first comparison step, as shown in (A) of FIG. 5, the charges accumulated in the input signal capacitor Cs are Qx=4C×Vin and the voltage of the reference terminal is Vx=Qx/4C=Vin and 0 (GND)<Vin<+Vref/4, and therefore, the determination result is "1".

At the time of the second comparison step, as shown in (B) of FIG. 5, Qx=4C×Vin−2C×Vref, Vx=(4×Vref−2×Vref)/6, and 0 (GND)<Vin<+Vref/4, and therefore, the determination result is "0".

At the time of the third comparison step, as shown in (C) of FIG. 5, Qx=4C×Vin−2C×Vref−C×Vref=(4×Vin−3×Vref), Vx=(4×Vin−3×Vref)/7, and 0 (GND)<Vin<+Vref/4, and therefore, the determination result is "0".

In this manner, the converted digital value is "100".

In the above-mentioned charge-sharing SAR ADC, the capacitance values of the reference capacitors Cn-1 to C1 and the input signal capacitor Cs are set to 1:2:4, $2^{n-2}:2^{n-1}$, i.e., a ratio of powers of 2.

In the general SAR ADC, in each step, a comparator with high power consumption and low noise is used. In contrast to this, M. Hesener, T. Eichler, A. Hanneberg, D. Herbison, F. Kuttner, H. Wenske ("A 14b 40MS/s Redundant SAR ADC with 480 MHz Clock in 0.13 um CMOS" Tech. Digest of ISSCC (February 2007)) proposes to use a comparator with low power consumption and high noise in the first half and a comparator with high power consumption and low noise in the second half in the charge-sharing SAR ADC to further reduce power consumption. In the proposed method, a redundant step of one LSB transition is added to the last of the binary algorithm and at first, a comparator with high noise and low power consumption is used and in the last two steps, a comparator with low noise/high power consumption is used. Then, by correcting the determination error due to the noise of the comparator with high noise in the last two steps in which the comparator with low noise is used, high precision and low power consumption are realized. As a comparator, a dynamic comparator is used. Through the dynamic comparator, no constant current flows, and therefore, power is consumed only by the comparator that operates. Consequently, power consumption can be reduced in the period of time during which the comparator with low power consumption is used in the first half.

SUMMARY OF THE INVENTION

However, the method proposed in V. Giannini, P. Nuzzo, V. Chironi, A. Baschirotto, G. V. Plas, J. Craninckx "An 820 µW 9b 40MS/s Noise-Tolerant Dynamic-SAR ADC in 90 nm Digital CMOS" ISSCC (February 2008) has such a problem that precision is deteriorated by a mismatch of an input-converted offset between two comparators.

FIG. 6 is a circuit diagram of the comparator described in V. Giannini, P. Nuzzo, V. Chironi, A. Baschirotto, G. V. Plas, J. Craninckx "An 820 µW 9b 40MS/s Noise-Tolerant Dynamic-SAR ADC in 90 nm Digital CMOS" ISSCC (February 2008). The comparator schematically shown is a widely-known dynamic comparator; however, variable capacitors VRp and VRn are provided to enable the adjustment of offset and the input-converted offset voltage between the two comparators is adjusted to within ½ LSB.

However, when the variable capacitors VRp and VRn are provided, the size of the circuit is increased accordingly and such a problem arises that it is necessary to provide an offset adjusting process in the manufacturing process and the cost is increased accordingly.

An object of the present invention is to realize an SAR ADC that has a simple configuration and meets the demands of high speed, high precision, and low power consumption.

According to the present invention, in order to solve the above-mentioned problem, the non-binary algorithm is applied to an SAR (Successive Approximation Register) analog-to-digital converter (ADC) that uses two comparators with offset by switching them on the way.

That is, according to a first aspect in which the present invention is applied to an SAR analog-to-digital converter having a DA converter, the SAR analog-to-digital converter is an analog-to-digital converter including a digital-to-analog converter that outputs a reference analog signal according to a multibit digital signal; a first comparator that compares an input analog signal with a reference analog signal; a second comparator that compares an input analog signal with a reference analog signal; a selection circuit that selects one of comparison results of the first comparator and the second comparator; and a control circuit that changes the multibit digital signal sequentially based on the selected comparison result in a plurality of steps so that the reference analog signal becomes closer to the input analog signal, the control circuit controls the selection circuit to select the comparison result of the first comparator up to an intermediate step on the way of the plurality of steps and to select the comparison result of the second comparator after the intermediate step, and changes the bit value of the multibit digital signal according to the non-binary algorithm.

According to a second aspect in which the present invention is applied to a charge-sharing SAR analog-to-digital converter, the charge-sharing SAR analog-to-digital converter is an analog-to-digital converter including an input signal capacitor having an input terminal to which an analog input signal is applied at the time of sampling and a reference terminal connected to a reference potential and holding a charge amount corresponding to a voltage of an analog input signal applied at the time of sampling; one or more reference capacitors holding a charge amount corresponding to a voltage of a reference voltage applied at the time of sampling, two terminals of each reference capacitor are configured to be capable of being connected to the input terminal and the reference terminal of the input signal capacitor either in the forward connection state or in the backward connection state; a first comparator that determines whether the voltage of the input terminal of the input signal capacitor is higher or lower than the reference potential; a second comparator that determines whether the voltage of the input terminal of the input signal capacitor is higher or lower than the reference potential; a selection circuit that selects one of comparison results of the first comparator and the second comparator; and a control circuit that sequentially connects while selecting the connection state of the one or more reference capacitors with the input signal capacitor based on the selected comparison result in a plurality of steps so that the voltage of the input terminal of the input signal capacitor becomes closer to the reference potential and calculates a digital value corresponding to the voltage of the analog input signal from the determination result, the control circuit controls the selection circuit to select the comparison result of the first comparator up to an intermediate step on the way of the plurality of steps and to select the comparison result of the second comparator after the intermediate step, and the capacitance values of the input signal capacitor and the one or more reference capacitors are set to non-binary values.

It is desirable that the first and second comparators are a dynamic comparator and a constant current that do not flow when not selected.

The first comparator consumes less power compared to the second comparator; however, has high noise, and for example, the first comparator has the same circuit configuration as that of the second comparator, however, is smaller in size.

According to a first aspect, the control circuit changes the bit value of the multibit digital signal according to the binary algorithm in a plurality of steps before the intermediate step. Further, according to the second aspect, it is desirable for the capacitance value of the reference capacitor connected to the input signal capacitor before the intermediate step to be set in the binary system.

According to the present invention, the redundant non-binary algorithm is applied, and therefore, the number of times of comparison processing (steps) and the number of the reference capacitors increase somewhat; however, it is possible to increase the allowable range of the offset mismatch of the two comparators.

According to the present invention, it is possible to improve precision of the SAR ADC capable of high-speed operations and having a low power consumption.

BRIEF DESCRIPTION OF THE DRAWINGS

The features and advantages of the invention will be more clearly understood from the following description taken in conjunction with accompanying drawings, in which:

FIG. 3 is a block diagram showing a configuration example of a general charge-sharing SAR ADC;

FIG. 10A is a diagram showing weight data of a digital signal that changes a reference analog signal in the SAR ADC in the first embodiment;

FIG. 10B and FIG. 10C are diagrams explaining an operation in the SAR ADC in the first embodiment;

FIG. 12 is a diagram showing weight data of a digital signal that changes a reference analog signal and an allowable error in the SAR ADC in the second embodiment;

DESCRIPTION OF THE PREFERRED EMBODIMENTS

Figure 7:
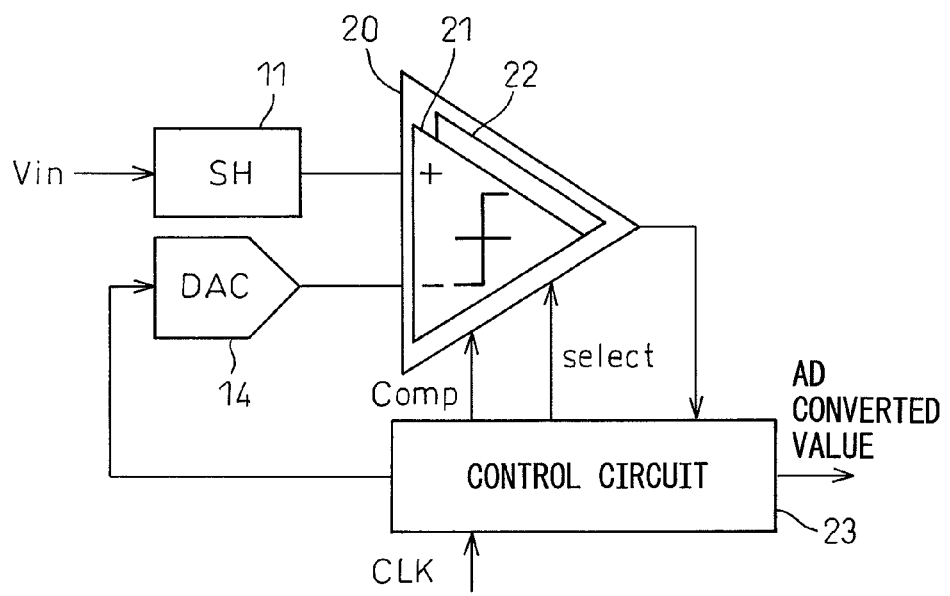
FIG. 7 is a diagram showing a configuration of an SAR ADC in a first embodiment of the present invention.

FIG. 7 is a diagram showing a configuration of a sequential comparison-type approximation analog-to-digital converter (SAR ADC) in a first embodiment of the present invention. As shown in FIG. 7, the SAR ADC in the first embodiment comprises a comparator unit 20, a control circuit 23, and the DA converter (DAC) 14. The analog input signal Vin is held temporarily by, for example, the sample-holding (SH) circuit 11 and input to the comparator unit 20.

Figure 8:
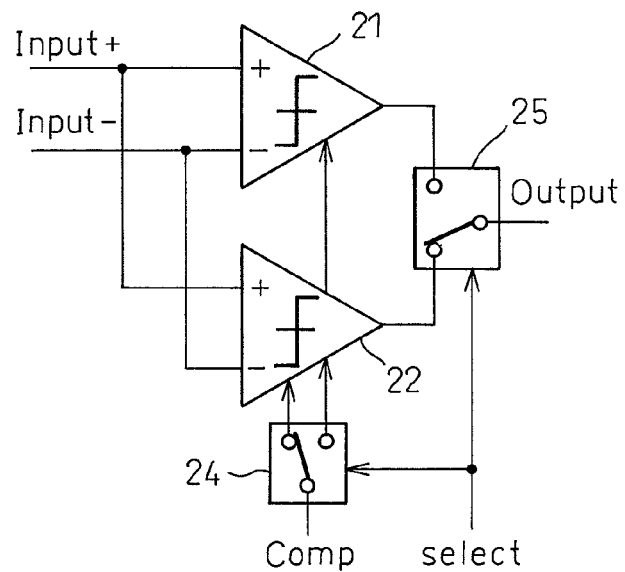
FIG. 8 is a diagram showing a configuration of a comparator part comprised by the SAR ADC in the first embodiment.

FIG. 8 is a diagram showing a configuration of the comparator unit 20. The comparator unit 20 comprises a first comparator 21, a second comparator 22, an operating state selection circuit 24 that selects one of the first comparator 21 and the second comparator 22 to which a signal Comp is applied to bring the comparator into an operating state, and a selection circuit (selector) 25 that selects and outputs an output of one of the first comparator 21 and the second comparator 22 according to a selection signal select. The operating state selection circuit 24 selects one of the first comparator 21 and the second comparator 22 to which the signal Comp is applied according to the selection signal select.

Figure 6:
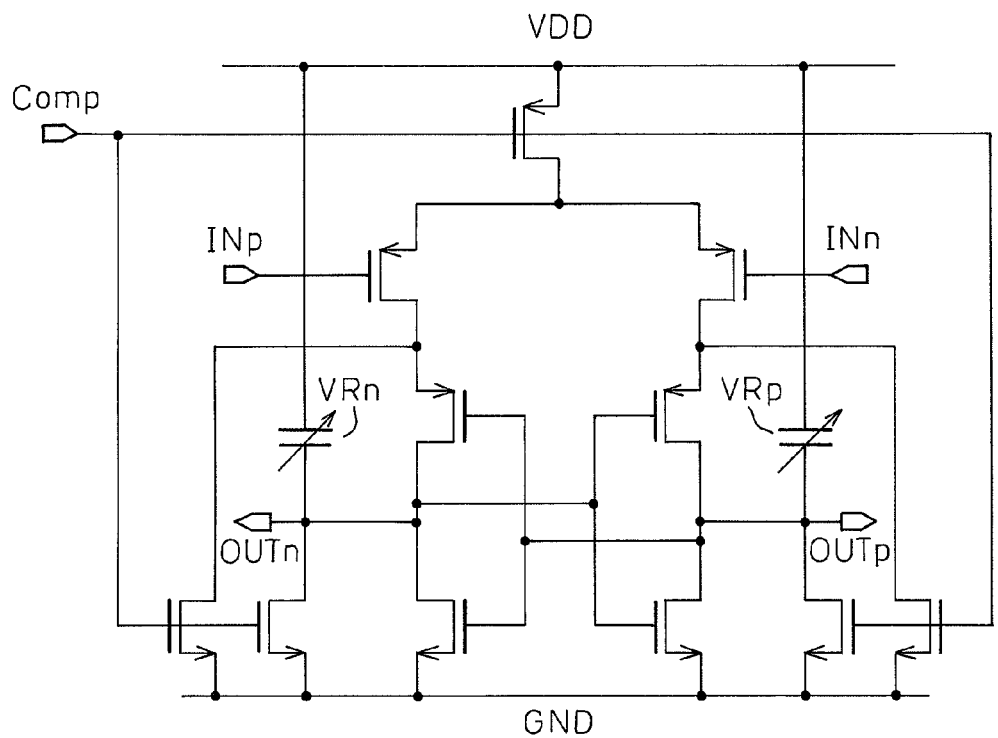
FIG. 6 is a circuit diagram of a comparator comprising a variable capacitor for offset adjustment.
Figure 9:
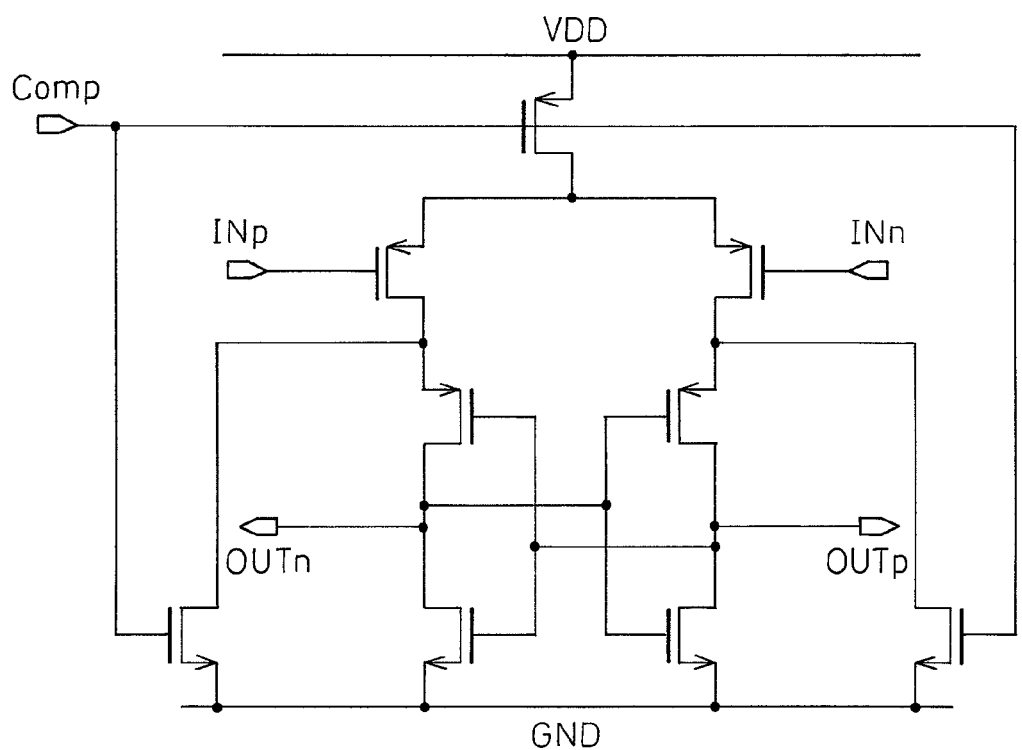
FIG. 9 is a circuit diagram of a comparator comprised by the SAR ADC in the first embodiment.

FIG. 9 is a circuit diagram of the first comparator 21 and the second comparator 22. The comparator in FIG. 9 is a dynamic comparator having a circuit configuration similar to that of a comparator in a conventional example in FIG. 6; however, differs from the latter in that the variable capacitors VRp and VRn are not provided. The first comparator 21 and the second comparator 22 have the same circuit configuration; however, the size of the first comparator 21 is smaller than the size of the second comparator 22. The first comparator 21 is small, and therefore, the power consumption is smaller compared to that of the second comparator 22; however, first comparator is noisier. The comparator in FIG. 9 performs a comparison operation at high speed when the signal Comp is applied and a constant current flows; however, comparator in FIG. 9 does not operate when the signal Comp is not applied and the power consumption is substantially zero because no constant current flows.

Figure 1:
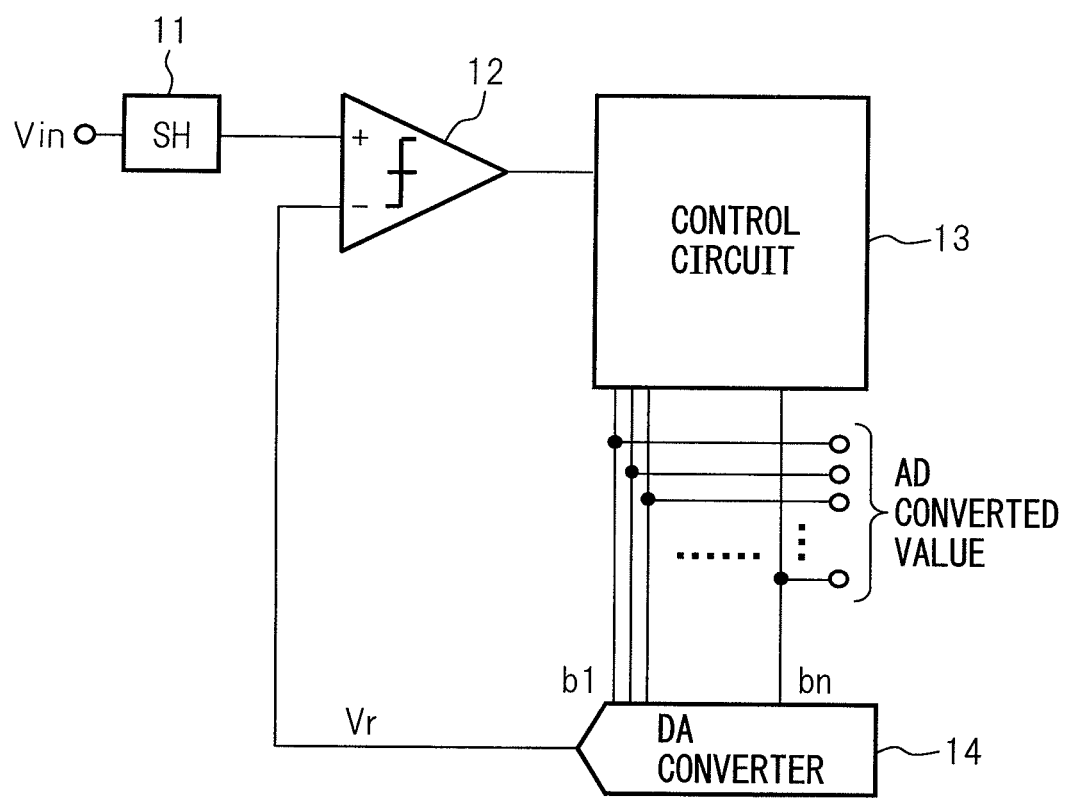
FIG. 1 is a block diagram showing a configuration example of a conventional sequential comparison-type comparator ADC.
Figure 2:
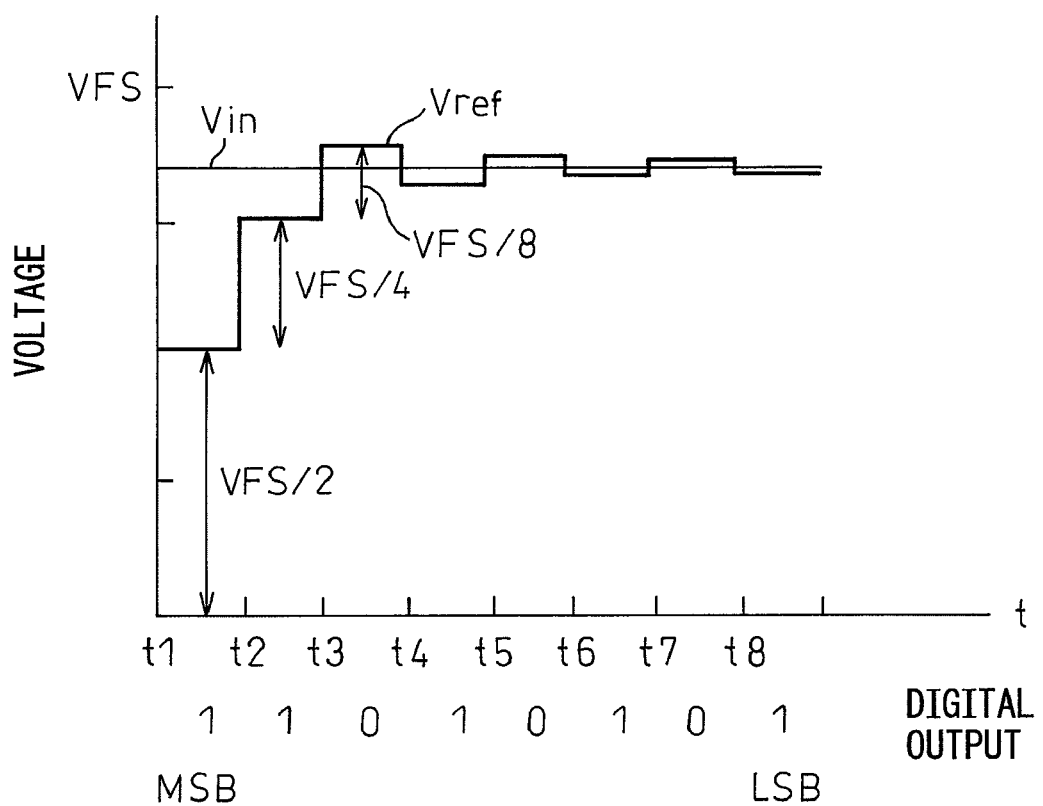
FIG. 2 is a diagram explaining a conversion operation in a sequential comparison-type ADC.
Figure 4A:
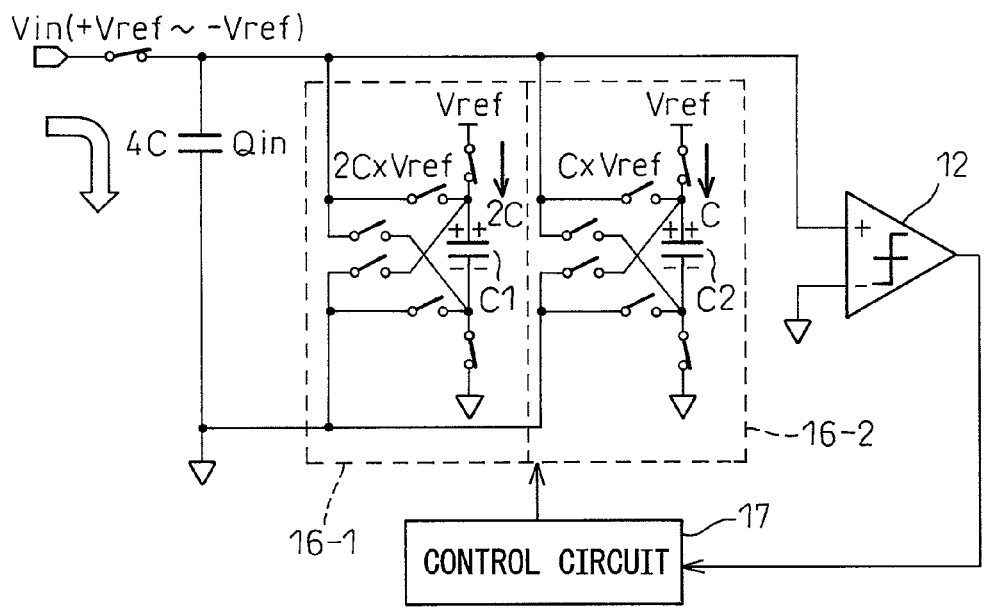
FIG. 4A to FIG. 4F are diagrams explaining a conversion operation of a charge-sharing SAR ADC.
Figure 4B:
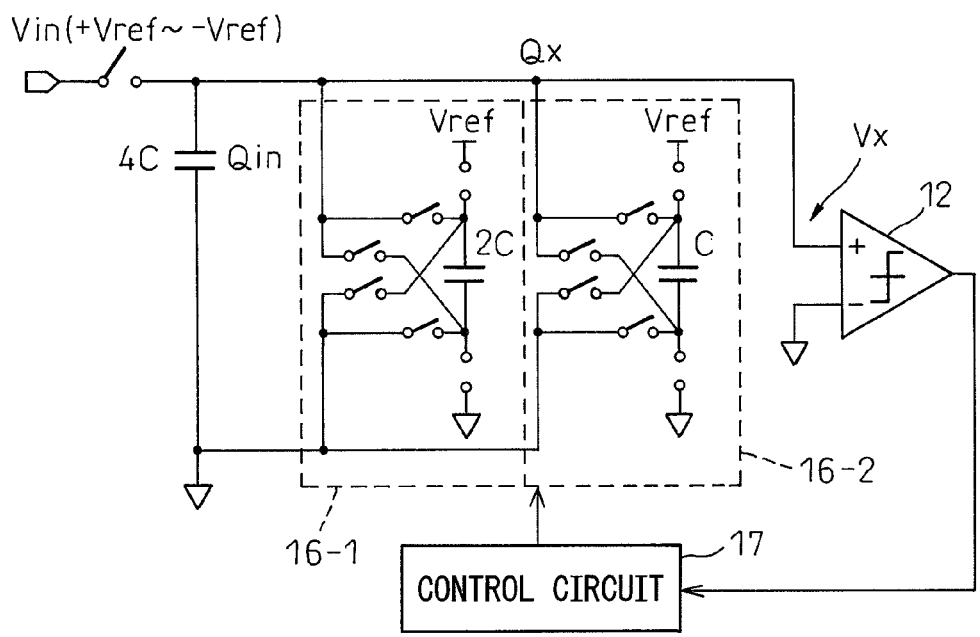
Figure 4C:
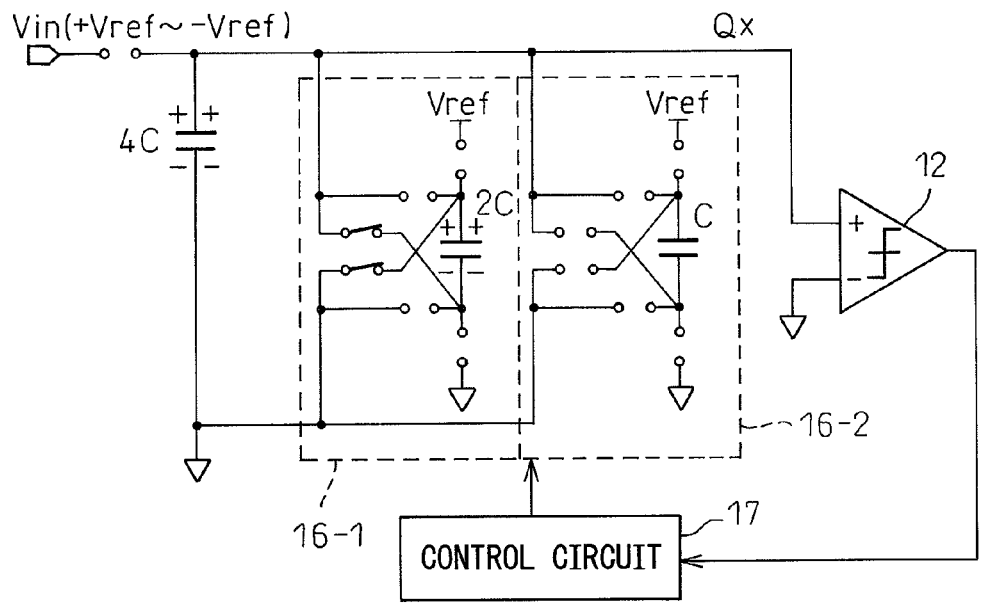
Figure 4D:
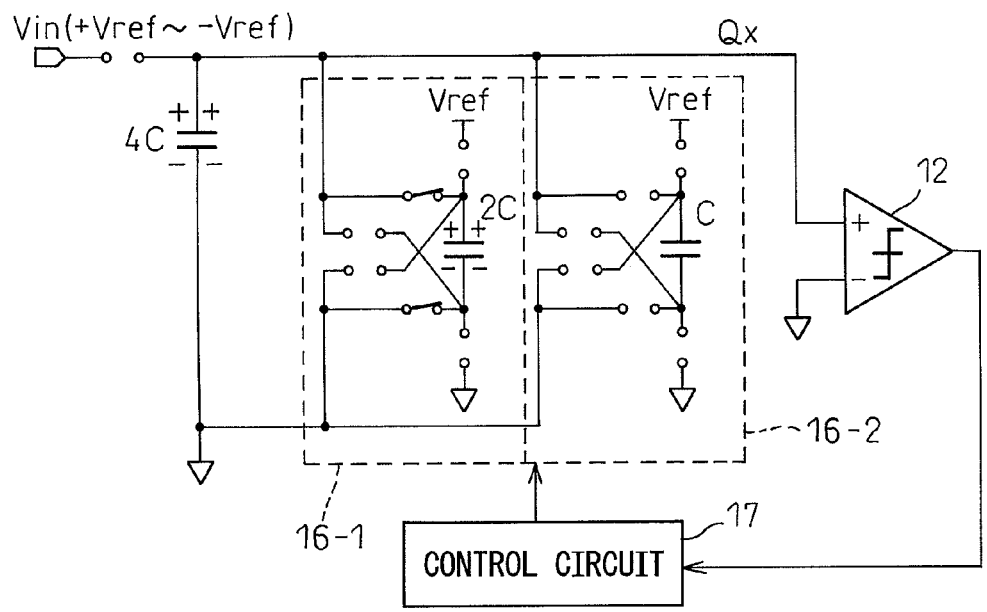
Figure 4E:
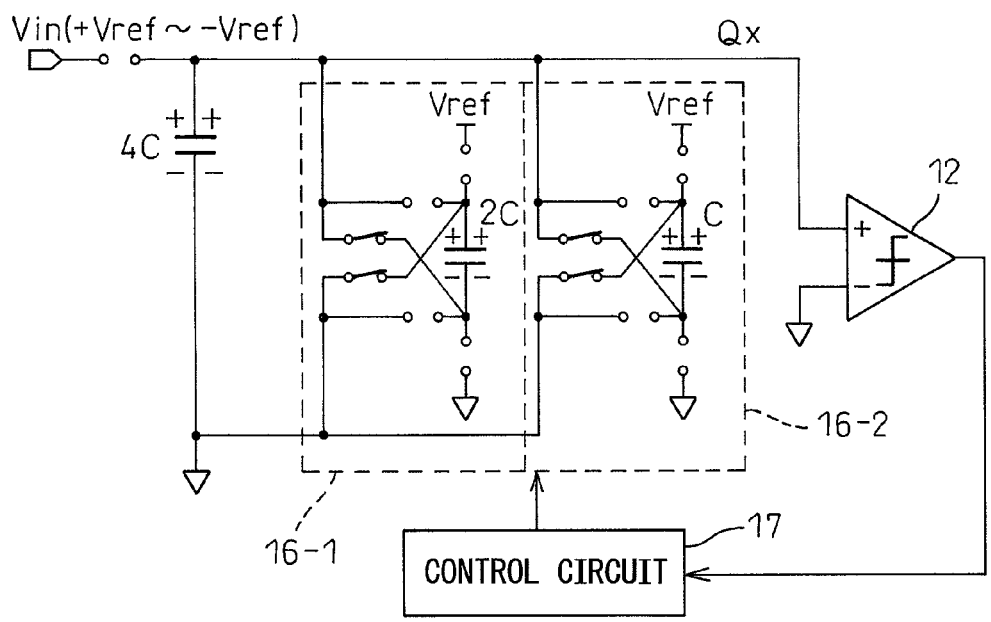
Figure 4F:
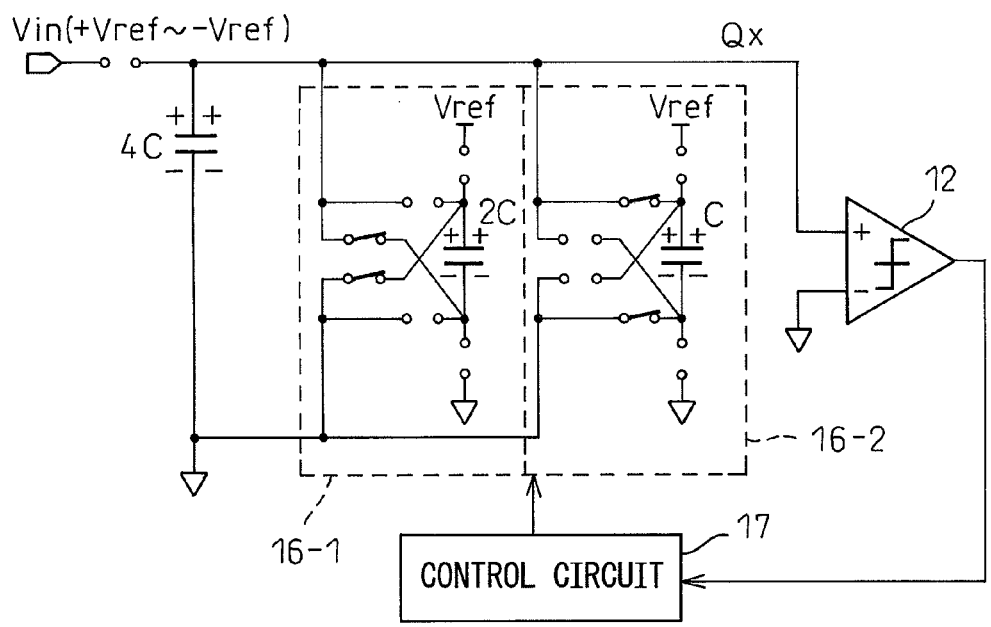
Figure 5:
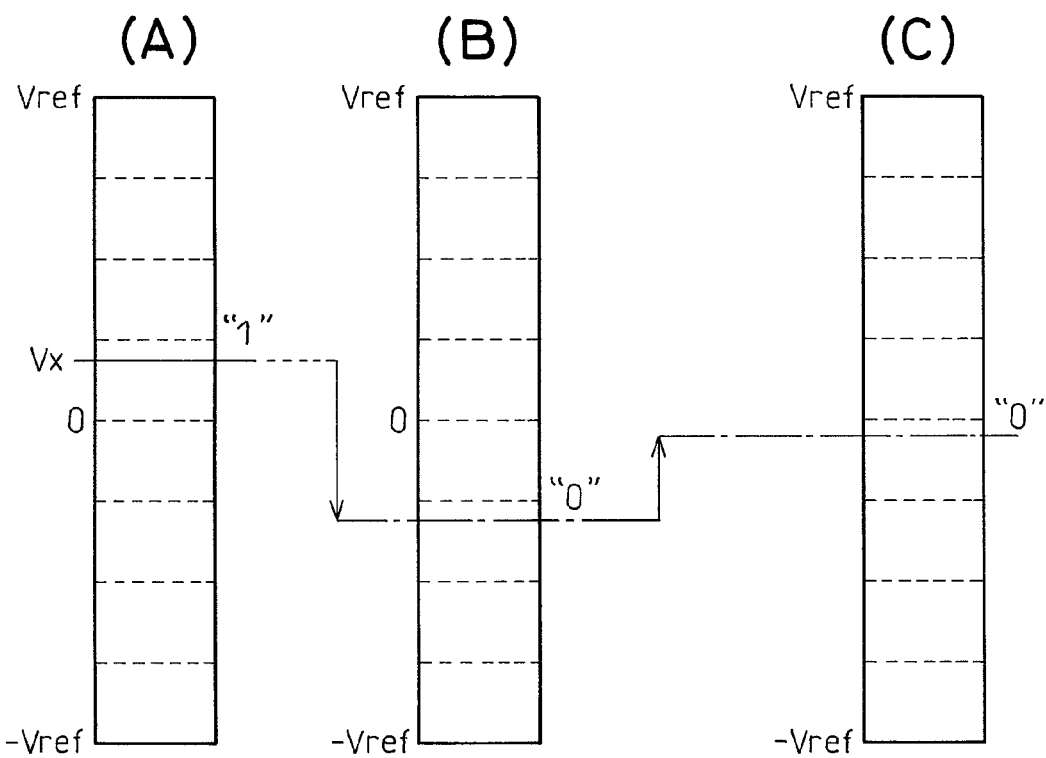
FIG. 5 is a diagram explaining a comparison step and a determination result for a certain analog input signal value in a charge-sharing SAR ADC.

Returning to FIG. 7, the control circuit 23 changes the digital signal given to the DAC 14 so as to perform sequential comparison approximation as in the control circuit 13 in FIG. 1 does; however, control circuit 23 differs from the latter in that the shift weight to change is changed in the non-binary system and the selection signal select is generated to switch the comparator to be used from the first comparator 21 to the second comparator 22 on the way.

FIG. 10A to FIG. 10C are diagrams explaining an operation example when the SAR ADC in the first embodiment is assumed to be a 5-bit DAC. Because of five bits, the AD converted values have 32 levels from 0 to 31.

When the shift weight is binary, five steps of comparison operation are performed in the 5-bit DAC; however, in the SAR ADC in the first embodiment, as shown in FIG. 10A, six steps of comparison operation are performed. Then, in first to third steps, the first comparator 21 with low power consumption but high noise is used and in fourth to sixth steps, the second comparator 22 with high power consumption but low noise is used. In FIG. 8, in the first to third steps, the operating state selection circuit 24 supplies the signal Comp to the first comparator 21 and the selector 25 selects the output of the first comparator 21. In the first to third steps, the second comparator 22 is in the non-operating state. In the fourth to sixth steps, the operating state selection circuit 24 supplies the signal Comp to the second comparator 22 and the selector 25 selects the output of the second comparator 22. In the fourth to sixth steps, the first comparator 21 is in the non-operating state.

As shown in FIG. 10A, the comparison level in the first step is 16 and the shift weights in the second to sixth steps are 6, 4, 2, 2, 1, set in the non-binary system. In FIG. 10A, the level of Vin is between 23 and 24, indicating the determination result and the change in comparison level when it is assumed that there is no error. At this time, the determination results are "1", "1", "0", "0", "1", "1" in the first to sixth steps. The comparison level in the first step is 16, the determination result in the first step is "1", and the shift weight in the second step is 6, and therefore, the comparison level in the second step is 16+6=22. The comparison level in the second step is 22, the determination result in the second step is "1", and the shift weight in the third step is 4, and therefore, the comparison level in the third step is 22+4=26. Hereinafter, the comparison levels in the fourth to sixth steps change 24, 22, 23 similarly.

FIG. 10B shows the determination result and the change in comparison level when it is assumed that the level of Vin is between 23 and 24 and there is no error. The change in the comparison level is calculated and when the determination result in the last step is "1", then the comparison level in the last step is taken as the AD converted value and when the determination result in the last step is "0", then the comparison level in the last step from which 1 is subtracted is taken as the AD converted value. Consequently, in the case described above, the comparison level in the sixth step is 23 and the determination result in the sixth step is "1", and therefore, the AD converted value is 23.

FIG. 10C shows the determination result and the change in comparison level when it is assumed that there is an offset mismatch in which the offset of the first comparator 21 is different from the offset of the second comparator 22. The final determination is made by utilizing the output of the second comparator 22, and therefore, the influence of the offset mismatch appears in the form in which the comparison level of the first comparator 21 differs from the comparison level of the second comparator 22. FIG. 10C shows the determination result and an example of the change in comparison level on the assumption that the comparison level of the first comparator 21 is two levels higher than the comparison level of the second comparator 22. The comparison level in the first to third steps is two levels higher than that in the fourth to sixth steps, and therefore, the comparison level in the first step changes from 16 to 18. When Vin is at level 23, the determination result is "1". The comparison level in the second step is 22, however, in fact it is 24 because of the offset mismatch and Vin is at level 23, and therefore, the determination result is "0" and an error occurs. In this case, the comparison level in the third step is 18; however, in fact it is 20 because of the offset mismatch and the determination result is "1". In this state, the comparator is switched to the second comparator 22. The comparison level in the fourth step is 20 and because there is no longer an offset mismatch, and therefore, the comparison level remains at level 20 and the determination result is "1". In the fifth step, the comparison level is 22 and the determination result is "1". In the sixth step, the comparison level is 23 and the determination result is "1". As described above, when the determination result in the final step is "1", the comparison level in the final step is the AD converted value, and therefore, the AD converted value is 23.

As explained in FIG. 10C, in the first embodiment, even when there exists an offset mismatch when the first comparator 21 is switched to the second comparator 22, if it is within the allowable range, the non-binary algorithm is applied, and therefore, it is possible to calculate a correct AD converted value.

As explained above, in the first embodiment, in the steps in the former half, the first comparator 21 with low power consumption but high noise is used and in the steps in the latter half, the second comparator 22 with high power consumption but low noise is used, and therefore, it is possible to reduce power consumption compared to the conventional example in which the comparator with high power consumption and low noise is used in all the steps and the non-binary algorithm is applied, and therefore, it is possible to calculate a correct AD converted value by absorbing the influence of the offset mismatch of the first comparator 21 and the second comparator 22.

Figure 11:
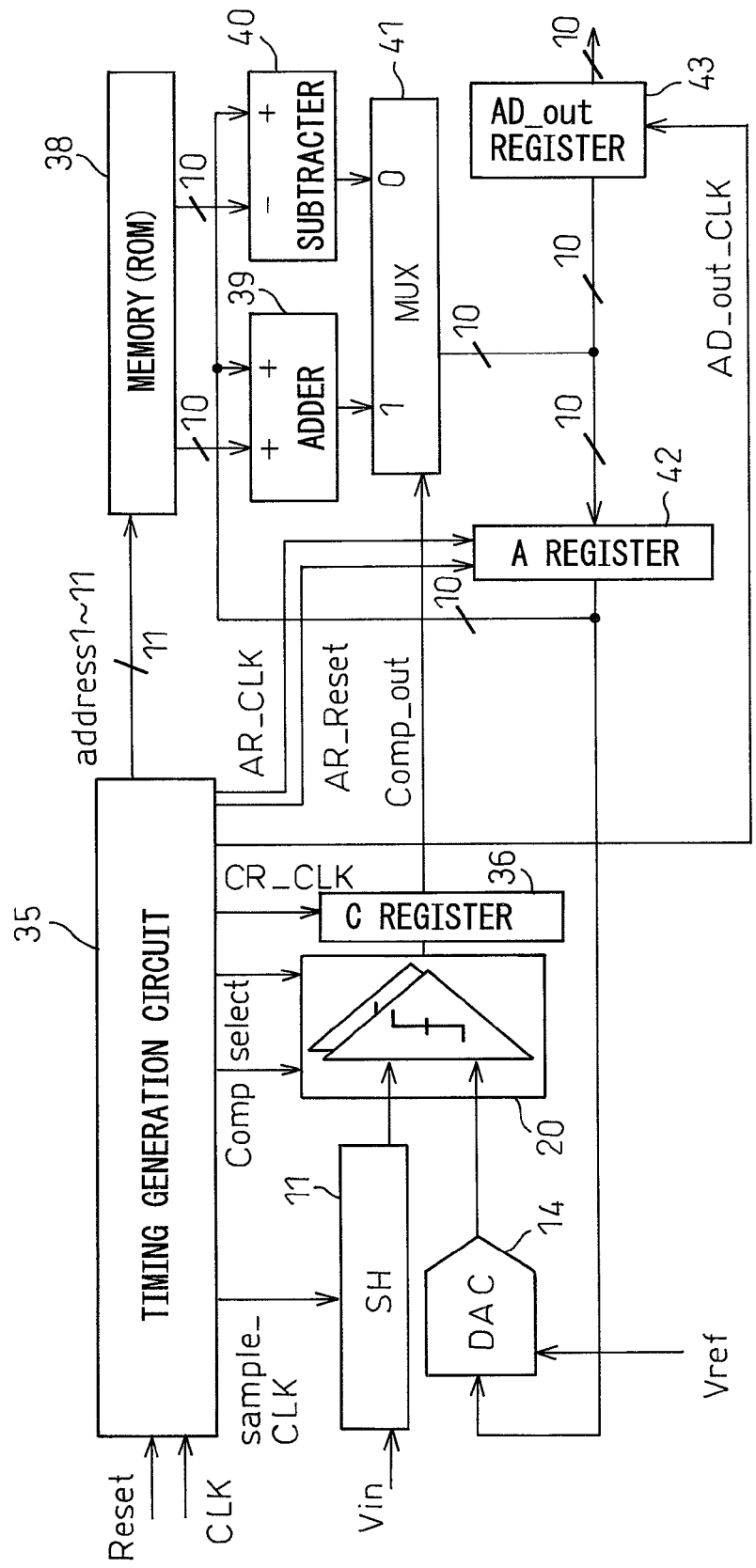
FIG. 11 is a diagram showing a configuration of an SAR ADC in a second embodiment of the present invention.

FIG. 11 is a diagram showing a configuration of a 10-bit SAR ADC in a second embodiment of the present invention.

The 10-bit charge-sharing SAR ADC in the second embodiment comprises the DAC 14, the comparator unit 20, a timing generation circuit 35, a C register 36, a memory 38, an adder 39, a subtracter 40, a multiplexer 41, an A register 42, and an AD_out register 43. The sample-holding circuit (SH) 11, the DAC 14, and the comparator unit 20 are the same as those in the first embodiment and the comparator unit 20 has the first comparator 21 and the second comparator 22. The timing generation circuit 35, the C register 36, the memory 38, the adder 39, the subtracter 40, the multiplexer 41, the A register 42, and the AD_out register 43 form the part corresponding to the control circuit 23 in the first embodiment.

The timing generation circuit 35 receives a reset signal Reset and a clock CLK and generates and outputs a timing signal sample_CLK, the timing signals Comp, select, and timing signals CR_CLK, address1-11, AR_Reset, AR_CLK, and AD_out_CLIK to control each part.

The signal sample_CLK is a signal that is ON during the sampling period of time. The sample-holding circuit (SH) 11 takes in and holds the analog input signal Vin according to the signal sample_CLK.

The comparator unit 20 selects a comparator to be brought into an operating state according to the signals comp and select and outputs the comparison result.

The C register 36 latches the output of the comparator unit 20 according to the signal CR_CLK and outputs it as Comp_out.

The memory 38 is configured by a ROM and stores the shift weight value in association with the signal address1-10 and outputs a value stored according to the input signal address1-10. Further, the memory 38 stores a value in association with the signal address11 so as to output "0" to the adder 39 and "1" to the subtracter.

The adder 39 adds the output value of the memory 38 to the output value of the A register 42 and outputs the addition result to the multiplexer 41 and the subtracter 40 subtracts the output value of the memory 38 from the output value of the A register 42 and outputs the subtraction result to the multiplexer 41.

The multiplexer 41 selects and outputs one of the outputs of the adder 39 and the subtracter 40 based on the determination result output from the C register 36.

The A register 42 outputs an initial value set in advance according to the signal AR_Reset and after that, latches the output of a multiplexer 41 according to the signal AR_CLK and outputs the output to the DAC 14, the adder 39, and the subtracter 40.

The AD_out register 43 latches the output of the multiplexer 41 according to AD_out_CLK and outputs the output as an AD converted value.

FIG. 12 shows comparison levels DAC (k) in the kth step to be given to the DAC 14, allowable 1LSB-converted offset errors er (k), and error allowable values expressed in LSB in the second embodiment. The comparison level DAC (1) is set as an initial value in the A register 42 and the comparison levels DAC (2) to DAC (11) are stored in the memory 38 in correspondence to the signal address1-10. The step (k) (k=1 to 6) is the step in the former half in which the first comparator 21 is used and the step (k) (k=7 to 11) is the step in the latter half in which the second comparator 22 is used.

The 10-bit SAR ADC in the second embodiment operates similarly as in the first embodiment, except in that it performs comparison processing in 11 steps to calculate a 10-bit AD converted value. The operation is explained briefly.

At the time of sampling, SH11 takes in and holds the analog input signal Vin according to the signal sample_CLK and at the same time, the A register 42 outputs the initial value DAC (1) set in advance according to the signal AR_RESET. In response to this, the DAC 14 generates and outputs a reference analog signal corresponding to the DAC (1). Further, the comparator unit 20 is set so that the first comparator 21 enters the operating state according to the signals select, Comp and the determination result is output.

In the first comparison step, the reference analog signals corresponding to Vin and DAC (1) are compared. At this time, the memory 38 outputs DAC (2), the adder 39 outputs DAC (1)+DAC (2), and the subtracter 40 outputs DAC (1)−DAC (2). The multiplexer 41 selects and outputs the output of the adder 39 or the subtracter 40 based on the comparison result. The A register 42 latches the output of the multiplexer 41 and outputs it to the DAC 14, the adder 39, and the subtracter 40. Consequently, the A register 42 outputs DAC (1)+DAC (2) or DAC (1)−DAC (2) corresponding to the comparison level in the second comparison step.

In the second comparison step, the reference analog signals corresponding to Vin and DAC (1)+DAC (2) or DAC (1)−DAC (2) are compared and the comparison level in the third comparison step is calculated.

After that, the same operation is repeated up to the eleventh comparison step.

When the sixth comparison step is completed, the timing generation circuit 35 changes the signal select and in response to this, the comparator unit 20 is set so that the second comparator 22 enters the operating state and the determination result of the second comparator 22 is output.

In the final eleventh comparison step, the memory 38 outputs "0" to the adder 39 and outputs "1" to the subtracter 40 and the adder 39 adds 0 to the comparison level in the eleventh comparison step output from the A register 42, i.e., the adder 39 outputs the comparison level in the eleventh comparison step and the subtracter 40 outputs a value, which is the comparison level in the eleventh step minus 1. The multiplexer 41 selects and outputs the output of the adder 39 or the subtracter 40 according to the comparison result in the eleventh comparison step and the AD_out register 43 latches the output of the multiplexer 41 according to AD_out_CLK and outputs it as an AD converted value.

The AD conversion processing is completed as described above.

The algorithm for determining the comparison levels shown in FIG. 12 is explained.

First, the error caused by the comparator offset is estimated. Let an input-converted offset of the first comparator 21 be $V_{os1}$ and an input-converted offset of the second comparator 22 be $V_{os2}$. In the non-binary redundant algorithm, the error is considered with reference to the final step, and therefore, in the comparison in the steps in the former half, there is an error of $V_{os1}$-$V_{os2}$, as a result. Then $V_{os2}$ is the offset of the entire ADC. In the steps in the former half, the first comparator 21 with large noise is used, and therefore, it is necessary to design the redundant algorithm so that it can correct the offset error and noise.

For example, it is designed so that in ten bits, in the first comparator 21, at offset+4LSB, the noise is 3δ=1LSB and in the second comparator 22, at offset −2LSB, the noise is 3δ=0.2LSB. In the algorithm in the second embodiment, in the seventh to eleventh comparison steps, the second comparator 22 with small noise is used. Because the error allowable value is 8LSB, if the total of the offset mismatch of the two comparators and the noise is within ±8LSB, correction can be made. Further, the gradation of the output is −8 to +1,031, and therefore, if the offset of the second comparator 22 is within ±8LSB, the output is in 1,024 gradations without saturation. The offset can be corrected by subtracting the amount of offset from the final digital converted value.

When the two comparators are used, the error in each step becomes equal by the comparison processing of the first comparator 21 used in the steps in the former half. In this case, it is recommended to weight the comparison level in the binary system, prepare two comparison levels of the same weight according to the error to be allowed, and switch the comparator to the second comparator 22 from the comparison processing in the step.

According to the algorithm described above, DAC (k) in FIG. 12 is decided.

Figure 13:
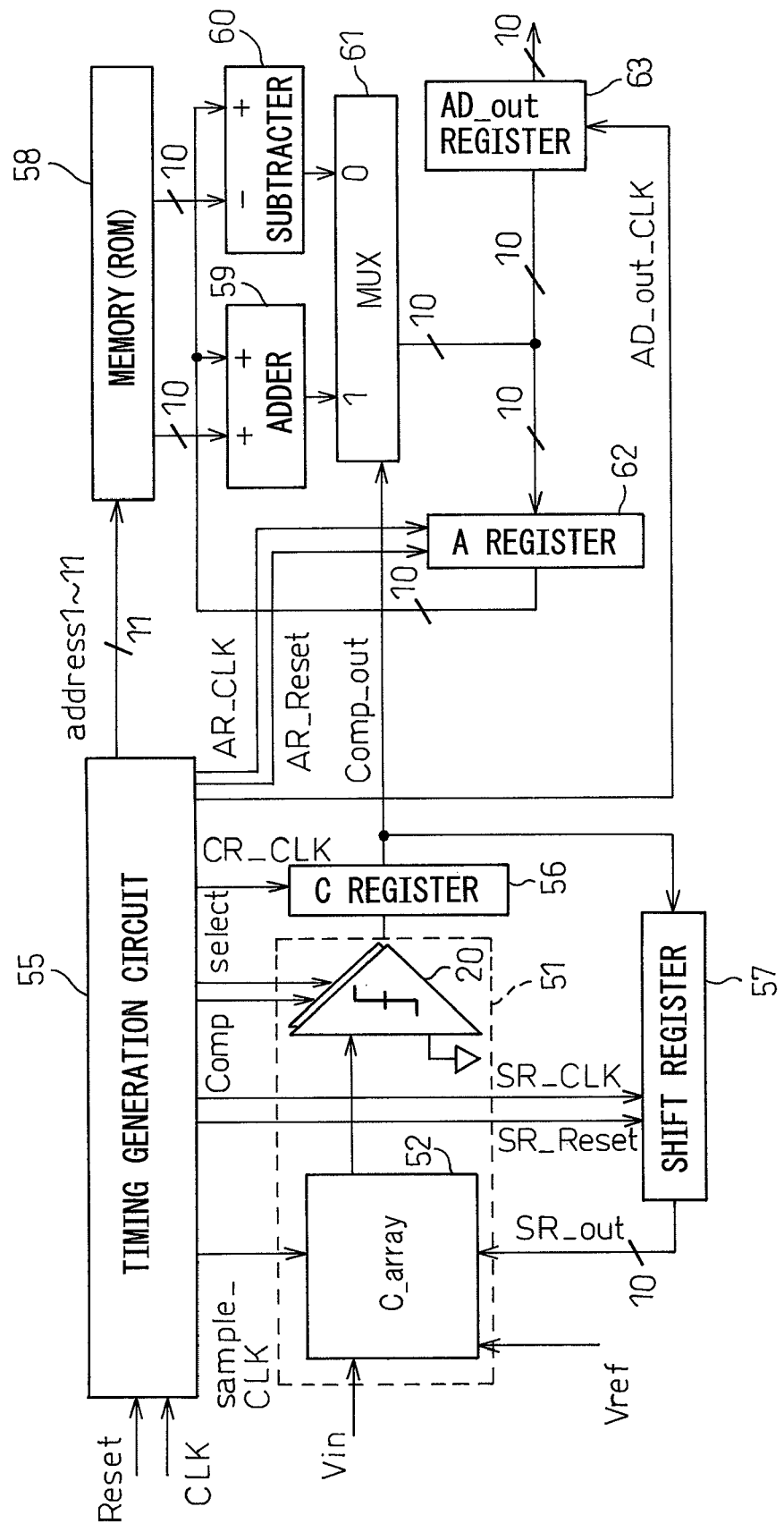
FIG. 13 is a diagram showing a configuration of a charge-sharing SAR ADC in a third embodiment of the present invention.
Figures 14, 15:
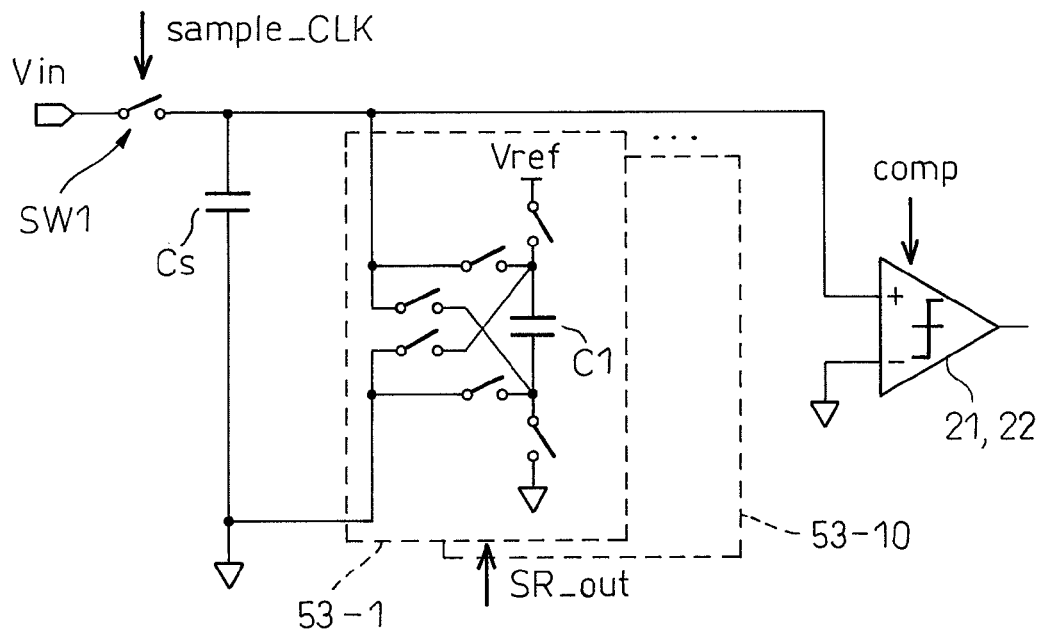
FIG. 14 is a diagram showing a configuration of portions of an input signal capacitor, a plurality of reference capacitors, and a comparator in the charge-sharing SAR ADC in the third embodiment.
FIG. 15 is a diagram showing the capacitance value and allowable error of the reference capacitor in the charge-sharing SAR ADC in the third embodiment.

FIG. 13 is a diagram showing a configuration of a 10-bit charge-sharing SAR ADC in a third embodiment of the present invention and FIG. 14 is a diagram showing a configuration of the parts of an input signal capacitor, a plurality of reference capacitors, and a comparator in the charge-sharing SAR ADC in the third embodiment.

As shown in FIG. 13, the charge-sharing SAR ADC in the third embodiment comprises a comparison processing part 51 having a C_array 52 and the comparator unit 20, a timing generation circuit 55, a C register 56, a shift register 57, a memory 58, an adder 59, a subtracter 60, the multiplexer 61, an A register 62, and an AD_out register 63. The parts except for the comparison processing part 51 form the part corresponding to the control circuit 17 in FIG. 3.

As shown in FIG. 14, the C_array 52 comprises the switch SW1, the input signal capacitor Cs, and 10 reference capacitor circuits 53-1, . . . , 53-10. As shown in FIG. 14, the configuration of each reference capacitor circuit has the same configuration as that of the conventional charge-sharing SAR ADC shown in FIG. 3. However, the conventional n-bit charge-sharing SAR ADC comprises n−1, i.e., nine reference capacitor circuits in the case of 10 bits; however, the 10-bit charge-sharing SAR ADC in the present embodiment differs from the conventional charge-sharing SAR ADC shown in FIG. 3 in that it comprises 10 reference capacitor circuits and the capacitance values of the reference capacitors C0 to C10 provided in the 10 reference capacitor circuits are set according to the non-binary algorithm. Because 10 reference capacitor circuits are provided, 11 comparison steps are performed as a result. The switches SW11 and SW12 in the reference capacitor circuits 53-1, . . . , 53-10 are controlled by the signal sample_CLK and the switches SW13 to SW16 are controlled by a signal SR_out output from the shift register 57.

FIG. 15 shows capacitance values Cu (k) of the reference capacitors C1 to C10 (C (k) (k=1 to 9)), allowable 1LSB-converted offset errors er (k), and error allowable values expressed in LSB. The capacitance value Cu (k) is denoted by a relative value when the capacitance value of C10 is assumed to be 1. The capacitance value of the input signal capacitor Cs is 512 times the capacitance value of C10 and when the capacitance value of C10 is assumed to be C, it is 512C. The setting of the capacitance value Cu (k) of the reference capacitor shown in FIG. 15 will be described later.

Returning to FIG. 13, the timing generation circuit 55 receives the reset signal Reset and the clock CLK and generates and outputs the timing signals sample_CLK, SR-Reset, SR_CLK, Comp, CR_CLK, address1-11, AR_Reset, AR_CLK, and AD_out_CLK to control each part.

The signal sample_CLK is a signal that turns ON during the period of sampling and SW1 and switches SW11, SW12 in each reference capacitor circuit in FIG. 14 enter the closed state during the period during which the signal sample_CLK is ON and enters the open state during periods other than the period.

The comparator unit 20 selects a comparator that is to be brought into the operating state according to the signals comp and select and outputs the comparison result.

The C register 56 latches the output of the comparator unit 20 according to the signal CR_CLK and outputs it as Comp_out.

After resetting the value held according to the signal SR_Reset, the shift register 57 sequentially takes in and stores the output of the C resister according to the signal SR_CLK and outputs it as the signal SR_out.

The memory 58 is configured by a ROM and stores values corresponding to the capacitance values of the input signal capacitor Cs and the reference capacitors C1 to C10 in association with the signal address1-11 and outputs a stored value according to the signal address1-10 that is input. Further, the memory 58 stores values in association with the signal address 11 so as to output "0" to the adder 59 and "1" to the subtracter 60.

The adder 59 adds the output value of the memory 58 to the output value of the A register 62 and outputs the addition result to the multiplexer 61 and the subtracter 60 subtracts the output value of the memory 58 from the output value of the A register 62 and outputs the subtraction result to the multiplexer 61.

The multiplexer 61 selects and outputs one of the outputs of the adder 59 and the subtracter 60 based on the determination result output from the C register 56.

The A resister 62 outputs an initial value set in advance according to the signal AR_Rest and after that, latches the output of the multiplexer 61 according to the signal AR_CLK and outputs it to the adder 59 and the subtracter 60.

The AD_out register 63 latches the output of the multiplexer 61 according to AD_out_CLK and outputs it as a digital converted value.

Next, the operation of the 10-bit charge-sharing SAR ADC in the embodiment is explained. The charge-sharing SAR ADC in the embodiment performs the sampling step once and the comparison step 11 times and each step is performed in one clock. As described above, while the conventional 10-bit charge-sharing SAR ADC comprises the nine reference capacitor circuits and performs the sampling step once and the comparison step 10 times, the 10-bit reference capacitor circuit in the embodiment comprises the 10 reference capacitor circuits 53-1, . . . , 53-10 and performs the comparison step 11 times. The 10 reference capacitor circuits 53-1, . . . , 53-10 comprise the 10 reference capacitors C1 to C10 and the capacitance values of the reference capacitors C1 to C10 are weighted in accordance with the non-binary algorithm as shown in FIG. 15. When the sixth comparison step is completed, the timing generation circuit 55 varies the signal select and in response to this, the comparator unit 20 is set so that the second comparator 22 enters the operating state and the determination result of the second comparator 22 is output.

First, the sampling step is performed according to the signal Reset. In the sampling step, as in the conventional example, SW1 is brought into the closed state and the analog input signal Vin is applied to the input signal capacitor Cs and at the same time, SW11 and SW12 are brought into the closed state and SW13 to SW16 are brought into the open state and the reference voltage Vref is applied to the reference capacitors C1 to C10 in the reference capacitor circuits 53-1, . . . , 53-10. After that, SW1 is brought into the open state and SW11 and SW12 are brought into the open state. Due to this, in the input signal capacitor Cs, charges of Qin=512C×Vin are accumulated and in the reference capacitors C1 to C10, Cu (k)×Vref (k=1 to 10) is accumulated. Further, the A register 62 is set so as to output an intermediate value of the initial value 512, i.e., a 10-bit digital value. The comparator unit 20 is set so that the first comparator 21 enters the operating state according to the signals select, Comp and the determination result of the first comparator 21 is output.

In the first comparison step, the first comparator 21 determines whether the voltage of the input terminal of the input signal capacitor Cs is higher or lower than GND. At this time, the memory 58 outputs Cu (1)=256 of C1 stored in the first address and the adder 59 outputs a value of 768, which is the initial value of 512 output from the A register 62 plus 256, and the subtracter 60 outputs a value of 256, which is the initial value of 512 output from the A register 62 minus 256, respectively. The multiplexer 61 selects the value of 768 output from the adder 59 when the determination result is "high (1)" or selects the value of 256 output from the subtracter 60 when the determination result is "low (0)" and the A register 26 latches and outputs the value output from the multiplexer 61.

In the second comparison step, when the determination result in the first comparison step is "1", SW15 and SW16 in the reference capacitor circuit 53-1 are brought into the closed state and connection is made in the backward connection state where one of the terminals of the reference capacitor C1 is connected to the reference terminal of the input signal capacitor Cs and the other terminal of the reference capacitor C1 is connected to the input terminal of the input signal capacitor Cs. Due to this, the total changes accumulated in the input signal capacitor Cs and the reference capacitor C1 become Qx=512C×Vin−256C×Vref and the voltage of the reference terminal becomes Vx=Qx/(512C+256C)=(512× Vin−256×Vref)/768. In this state, the first comparator 21 makes a comparison.

When the determination result in the first comparison step is "0", SW13 and SW14 in the reference capacitor circuit 23-1 are brought into the closed state and connection is made in the forward connection state where one of the terminals of the reference capacitor C1 is connected to the input terminal of the input signal capacitor Cs and the other terminal of the reference capacitor C1 is connected to the reference terminal of the input signal capacitor Cs. Due to this, the total changes accumulated in the input signal capacitor Cs and the reference capacitor C1 become Qx=512C×Vin+256C×Vref and the voltage of the reference terminal becomes Vx=Qx/(512C+ 256C)=(512×Vin+256×Vref)/768. In this state, the first comparator 21 makes a comparison.

At this time, the memory 58 outputs Cu (2)=128 of C2 stored in the second address and the adder 59 outputs the value (768 or 256) output from the A register 62 to which 128 is added (that is, 896 or 384) and the subtracter 60 outputs the value (768 or 256) output from the A register 62 from which 128 is subtracted (that is, 640 or 128), respectively. The multiplexer 61 selects the value (896 or 384) output from the adder 59 when the determination result is "high (1)" or the value (640 or 128) output from the subtracter 30 when the determination result is "low (0)" and the A register 62 latches and outputs the value output from the multiplexer 61.

Subsequently, in the third to eleventh comparison steps, the reference capacitors C2 to C10 are connected to the input signal capacitor Cs according to the determination result in the previous step and Cu (3) to Cu (10) output from the memory 58 according to the steps are added to or subtracted from the value held in the A register 23 in the previous comparison step repeatedly and thus a digital converted value is generated.

As described above, when the sixth comparison step is completed, the timing generation circuit 55 varies the signal select and in response to this, the comparator unit 20 is set so that the second comparator 22 enters the operating state and the determination result of the second comparator 22 is output.

In the final eleventh comparison step, the memory 58 outputs "0" to the adder 59 and "1" to the subtracter 60 and the adder 59 outputs the comparison level as it is in the eleventh comparison step output from the A register 62 and the subtracter 60 outputs the comparison level in the eleventh step from which 1 is subtracted. The multiplexer 61 selects and outputs one of outputs of the adder 59 and the subtracter 60 according to the comparison result in the eleventh step and the AD_out register 63 latches the output of the multiplexer 61 according to the AD_out_CLK and outputs it as an AD converted value.

The AD conversion processing is completed as above.

Next, the correction algorithm for setting the capacitance values of the reference capacitors C1 to C10 is explained.

In this case, the offset is calculated in each step and difference from that in the final step is taken as an error. A charge-converted offset $Q_{os}(k)$ in each step is expressed by the following mathematical expression in the steps in the former half in which the first comparator 21 is used.

$$Q_{os}(k)=C_{sum}(k)*V_{os1}$$

The charge-converted offset $Q_{os}(k)$ is expressed by the following mathematical expression in the steps in the latter half in which the second comparator 22 is used.

$$Q_{os}(k)=C_{sum}(k)*V_{os2}$$

When the variations in the offset of the first comparator 21 are within a range of ±aV and the variations in the offset of the second comparator 22 are within a range of ±bV, a charge-converted error $Q_{er}$ by the offset in the steps in the former half is expressed by the following mathematical expression.

$$Q_{er}(k)=C_{sum}(k)*V_{os1}-C_{sum}(M)*V_{os2}|Q_{er}(k)|<(a+b)*C_{sum}(M)$$

Further, when the 3δ of noise Vno1 of the first comparator 21 is assumed to be cV, the error in the comparison in the former steps is expressed by the following mathematical expression $$Q_{er}(k)=C_{sum}(k)*V_{os1}-C_{sum}(M)*V_{os2}|Q_{er}(k)|<(a+b)*C_{sum}(M)$$

When the error relating to the charge sharing in the comparison in the steps in the latter half is sufficiently small, as in the case where two comparators are used, it is possible to make a correction by providing two reference capacitors with the same weight so that an error $(a+b+c)\times C_{sum}(M)$ in the comparison in the steps in the former half can be allowed.

As to the weights of the reference capacitors in FIG. 15, Cu(k) is determined in accordance with the algorithm described above on the assumption that when 10 bits, Vin=−1 V to +1 V, Vref=1 V, Cs=512C, the first comparator 21 has 3δ=0.2 mV of noise at offset +8 mV and the second comparator 22 has 3δ=1 mV of noise at offset −7 mV.

The present invention can be applied to a sequential comparison-type AD conversion circuit.

The embodiments of the present invention are explained as above; however, the embodiments described above are merely examples of how to carry out the invention and a person skilled in the art can easily understand that there can also be various modified examples within the scope of claims.

What is claimed is:

1. An analog-to-digital converter comprising:
    a digital-to-analog converter that outputs a reference analog signal according to a multibit digital signal;
    a first comparator that compares an input analog signal with the reference analog signal;
    a second comparator that compares an input analog signal with the reference analog signal;
    a selection circuit that selects one of comparison results of the first comparator and the second comparator; and
    a control circuit that sequentially varies the multibit digital signal based on the selected comparison result when sequentially determining each bit from a most significant bit to a least significant bit so that the reference analog signal becomes closer to the input analog signal, wherein
    the control circuit controls the selection circuit to select comparison results of the first comparator until an intermediate bit between the most significant bit and the least significant bit is determined and select comparison results of the second comparator after the intermediate bit is determined, and
    the bit values of the multibit digital signal are varied in accordance with a non-binary algorithm.

2. The analog-to-digital converter according to claim 1, wherein the first comparator and the second comparator are dynamic comparators.

3. The analog-to-digital converter according to claim 1, wherein
    the power consumption of the first comparator is lower than that of the second comparator, however, the noise of the former is higher than that of the latter.

4. The analog-to-digital converter according to claim 2, wherein
    the power consumption of the first comparator is lower than that of the second comparator, however, the noise of the former is higher than that of the latter.

5. The analog-to-digital converter according to claim 3, wherein
    the first comparator comprises the same circuit configuration as that of the second comparator, however, is smaller in size than the second comparator.

6. The analog-to-digital converter according to claim 4, wherein
    the first comparator comprises the same circuit configuration as that of the second comparator, however, is smaller in size than the second comparator.

7. The analog-to-digital converter according to claim 1, wherein
    the control circuit varies the bit values of the multibit digital signal in accordance with the binary algorithm until the intermediate bit is determined.

8. An analog-to-digital converter comprising:
an input signal capacitor that has an input terminal to which an analog input signal is applied at the time of sampling and a reference terminal connected to a reference potential and which holds a charge amount corresponding to a voltage of an analog input signal applied at the time of sampling;
one or more reference capacitors that hold a charge amount corresponding to a voltage of a reference voltage applied at the time of sampling and the two terminals of each of which are configured so as to be capable of being connected to the input terminal and the reference terminal of the input signal capacitor in either a forward connection state or a backward connection state;
a first comparator that determines whether the voltage of the input terminal of the input signal capacitor is higher or lower than the reference potential;
a second comparator that determines whether the voltage of the input terminal of the input signal capacitor is higher or lower than the reference potential;
a selection circuit that selects one of comparison results of the first comparator and the second comparator; and
a control circuit that sequentially makes connection while selecting a connection state with the input signal capacitor of the one or more reference capacitors based on the selected comparison result when sequentially determining each bit from a most significant bit to a least significant bit so that the voltage of the input terminal of the input signal capacitor becomes closer to the reference potential and which calculates a digital value corresponding to the voltage of the analog input signal from the determination result, wherein
the control circuit controls the selection circuit to select comparison results of the first comparator until an intermediate bit between the most significant bit and the least significant bit is determined and select comparison results of the second comparator after the intermediate bit is determined, and the capacitance values of the input signal capacitor and the one or more reference capacitors are set in the non-binary system.

9. The analog-to-digital converter according to claim 8, wherein
the first comparator and the second comparator are dynamic comparators.

10. The analog-to-digital converter according to claim 8, wherein
the power consumption of the first comparator is lower than that of the second comparator, however, the noise of the former is higher than that of the latter.

11. The analog-to-digital converter according to claim 9, wherein
the power consumption of the first comparator is lower than that of the second comparator, however, the noise of the former is higher than that of the latter.

12. The analog-to-digital converter according to claim 10, wherein the first comparator comprises the same circuit configuration as that of the second comparator, however, is smaller in size than the second comparator.

13. The analog-to-digital converter according to claim 11, wherein
the first comparator comprises the same circuit configuration as that of the second comparator, however, is smaller in size than the second comparator.

14. The analog-to-digital converter according to claim 8, wherein
the capacitance values of the input signal capacitor and the one or more reference capacitors are all different from one another.

15. The analog-to-digital converter according to claim 9, wherein
the capacitance values of the input signal capacitor and the one or more reference capacitors are all different from one another.

16. The analog-to-digital converter according to claim 10, wherein
the capacitance values of the input signal capacitor and the one or more reference capacitors are all different from one another.

17. The analog-to-digital converter according to claim 11, wherein
the capacitance values of the input signal capacitor and the one or more reference capacitors are all different from one another.

18. The analog-to-digital converter according to claim 12, wherein
the capacitance values of the input signal capacitor and the one or more reference capacitors are all different from one another.

19. The analog-to-digital converter according to claim 13, wherein
the capacitance values of the input signal capacitor and the one or more reference capacitors are all different from one another.

20. The analog-to-digital converter according to claim 8, wherein
the capacitance value of the reference capacitor connected to the input signal capacitor is set in the binary system until the intermediate bit is determined.

* * * * *